US009508600B1

(12) United States Patent
Basker

(10) Patent No.: US 9,508,600 B1
(45) Date of Patent: Nov. 29, 2016

(54) METHODS FOR CONTACT FORMATION FOR 10 NANOMETERS AND BEYOND WITH MINIMAL MASK COUNTS

(71) Applicant: International Business Machines Corporation, Armonk, NY (US)

(72) Inventor: Veeraraghavan S. Basker, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/967,725

(22) Filed: Dec. 14, 2015

Related U.S. Application Data

(63) Continuation of application No. 14/864,208, filed on Sep. 24, 2015.

(51) Int. Cl.
  *H01L 21/8234* (2006.01)
  *H01L 21/768* (2006.01)
  *H01L 21/32* (2006.01)
  *H01L 21/033* (2006.01)
  *H01L 21/311* (2006.01)
  *H01L 21/02* (2006.01)
  *H01L 21/285* (2006.01)

(52) U.S. Cl.
  CPC ... *H01L 21/823475* (2013.01); *H01L 21/0217* (2013.01); *H01L 21/02123* (2013.01); *H01L 21/02186* (2013.01); *H01L 21/0332* (2013.01); *H01L 21/28568* (2013.01); *H01L 21/31111* (2013.01); *H01L 21/32* (2013.01); *H01L 21/76802* (2013.01); *H01L 21/76879* (2013.01)

(58) Field of Classification Search
  CPC ............. H01L 21/0217; H01L 21/02186; H01L 21/28568; H01L 2924/01013; H01L 2924/01079; H01L 2924/14; H01L 23/5226; H01L 2924/01029

USPC .......................................... 438/666
See application file for complete search history.

(56) References Cited

U.S. PATENT DOCUMENTS

2014/0353801 A1* 12/2014 Jacob .................. H01L 21/761
  257/618
2015/0187945 A1* 7/2015 Kamineni ......... H01L 21/31144
  257/384

OTHER PUBLICATIONS

Basker, Veeraraghavan S., et al.; "Methods for Contact Formation for 10 Nanometers and Beyond With Minimal Mask counts"; U.S. Appl. No. 14/864,208, filed Sep. 24, 2015.
List of IBM Patents or Patent Applications Treated As Related—Date Filed: May 17, 2016; 1 page.

* cited by examiner

*Primary Examiner* — Walter H Swanson
(74) *Attorney, Agent, or Firm* — Cantor Colburn LLP; Vazken Alexanian

(57) ABSTRACT

A method of making a semiconductor device includes depositing a hard mask on a dielectric layer on a substrate, the dielectric layer being disposed around first, second, and third gates; removing a portion of the hard mask to form an opening that exposes the first, second, and third gates; forming a patterned soft mask on the first, second, and third gates within the opening, a first portion of the patterned soft mask being disposed on the first and second gates, and a second portion of the patterned soft mask being disposed on the second and third gates; removing portions of the dielectric layer to transfer the pattern of the patterned soft mask into the dielectric layer and form first and second contact openings between the first and second gates, and third and fourth contact openings between the second and third gates; and disposing a conductive material in the contact openings.

15 Claims, 6 Drawing Sheets

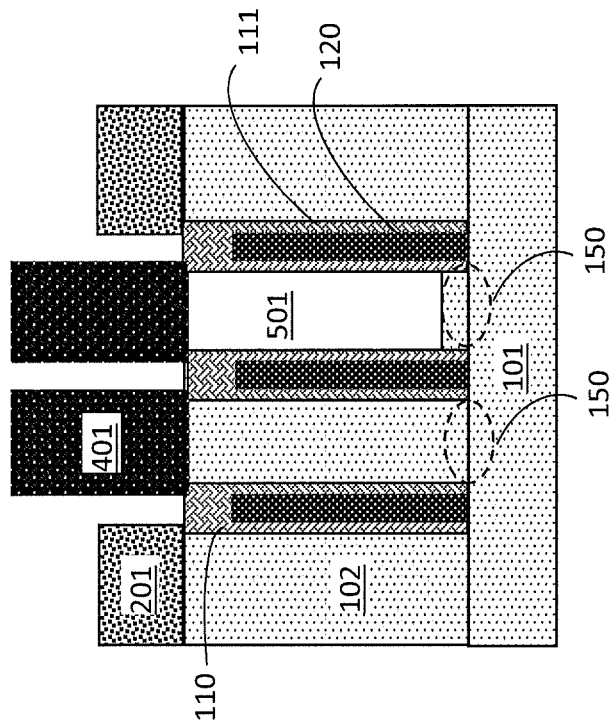
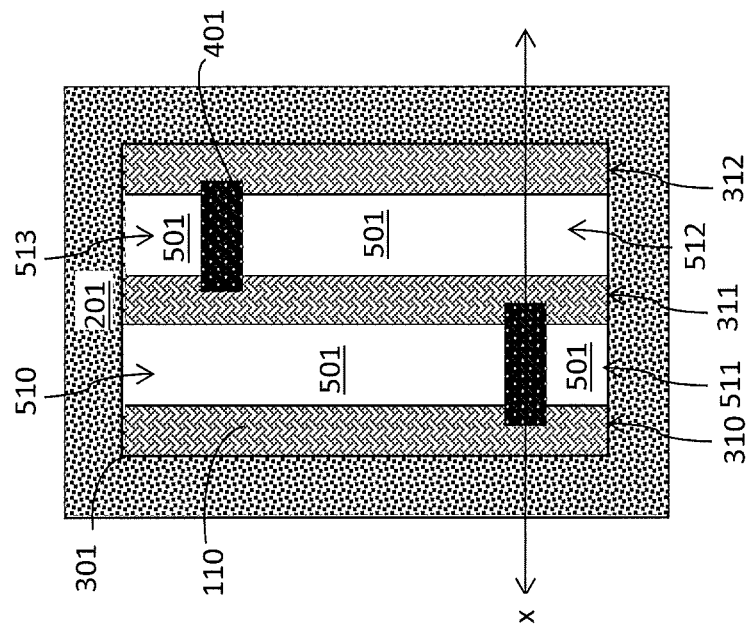
FIG. 5B
FIG. 5A

METHODS FOR CONTACT FORMATION FOR 10 NANOMETERS AND BEYOND WITH MINIMAL MASK COUNTS

PRIORITY

This application is a continuation of and claims priority from U.S. patent application Ser. No. 14/864,208, filed on Sep. 24, 2015, entitled "METHODS FOR CONTACT FORMATION FOR 10 NANOMETERS AND BEYOND WITH MINIMAL MASK COUNTS", the entire contents of which are incorporated herein by reference.

BACKGROUND

The present invention relates to metal-oxide-semiconductor field-effect transistors (MOSFET), and more specifically, to forming contacts in MOSFETs.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

SUMMARY

According to an embodiment, a method of making a semiconductor device includes depositing a hard mask on a dielectric layer disposed on a substrate; a first gate, a second gate, and a third gate extending from an exposed surface of the dielectric layer to the substrate; removing a portion of the hard mask to form an opening within the hard mask that exposes the first gate, the second gate, and the third gate; forming a patterned soft mask on the first, second, and third gates within the opening of the hard mask, a first portion of the patterned soft mask being disposed on the first gate and the second gate, and a second portion of the patterned soft mask being disposed on the second gate and the third gate; removing portions of the dielectric layer to transfer the pattern of the patterned soft mask into the dielectric layer and form a first contact opening and a second contact opening between the first gate and the second gate, and a third contact opening and a fourth contact opening between the second gate and the third gate; and disposing a conductive material in the first, second, third, and fourth contact openings.

According to another embodiment, a method of making a semiconductor device includes depositing a hard mask on a dielectric layer disposed on a substrate; a first gate, a second gate, and a third gate extending from an exposed surface of the dielectric layer to the substrate; removing a portion of the hard mask to form an opening within the hard mask that exposes the first gate, the second gate, and the third gate; disposing a soft mask material on the first, second, and third gates within the opening of the hard mask; removing portions of the soft mask material to form a first soft mask portion that is disposed on and extends from the first gate to the second gate, and a second soft mask portion that is disposed on and extends from the second gate to the third gate; removing portions of the dielectric layer to transfer a pattern of the first soft mask portion into the dielectric layer and form a first contact opening and a second contact opening between the first gate and the second gate, and to transfer a pattern of the second soft mask portion into the dielectric layer and form a third contact opening and a fourth contact opening between the second gate and the third gate; and disposing a conductive material in the first, second, third, and fourth contact openings.

Yet, according to another embodiment, a semiconductor device includes a first gate, a second gate, and a third gate disposed on a substrate; a dielectric layer disposed on the substrate and between the first gate and the second gate, and between the second gate and the third gate; a first contact opening that extends through the dielectric layer between the first gate and the second gate; a second contact opening that extends through the dielectric layer between the second gate and the third gate; and a conductive material disposed in the first contact opening and the second contact opening; wherein the first contact opening extends from a sidewall of the first gate to a sidewall of the second gate and has a sidewall that is substantially perpendicular to the first gate and the second gate, and the second contact opening extends from a sidewall of the second gate to a sidewall of the third gate and has a sidewall that is substantially perpendicular to the second gate and third gate.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-6B illustrate exemplary methods of making semiconductors device according to various embodiments, in which:

FIG. 1A is a top view of gates formed on a substrate;
FIG. 5A is a cross-sectional side view after removing a portion of the interlayer dielectric (ILD) around the patterned soft mask to form trench contacts;
FIG. 5B is a cross-sectional side view of FIG. 5A;
FIG. 6B is a cross-sectional side view of FIG. 6A.

DETAILED DESCRIPTION

Figure 1B:
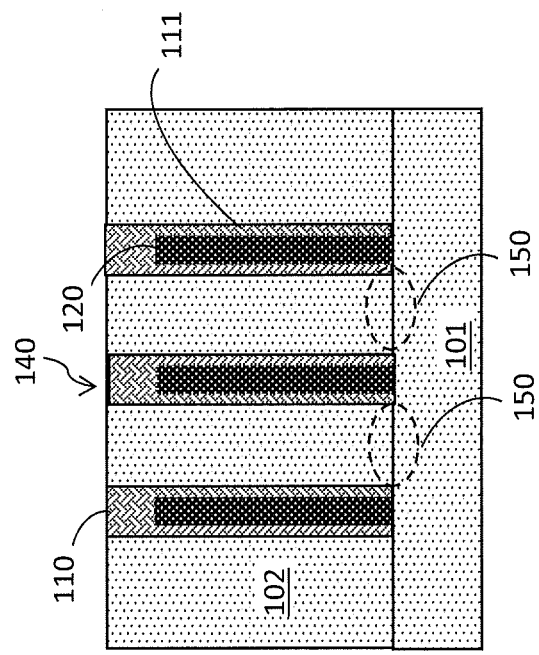
FIG. 1B is a cross-sectional side view of FIG. 1A.

As silicon integrated circuits scale to smaller dimensions, forming source/drain contacts near opposing sides of gates, while maintaining minimum insulator distances between the source/drain contacts may be challenging. Methods for forming source/drain contacts may include multiple masks, which may increase process complexity and cost.

Accordingly, various embodiments described herein include methods for forming contacts in semiconductor devices that minimize the number of masks and patterning steps. After forming a hard mask cap on gates, a sacrificial hard mask (block mask) is disposed on the gates and patterned to protect the field areas around the gates. Then a soft mask is disposed on the gates and patterned within the patterned hard mask area. The ILD is etched to form contact trenches in the areas within the patterned hard mask and around the patterned soft mask. After removing the masks, the contact trenches are filled with a conductive material to form source/drain contacts.

The methods described herein use a single hard mask and a soft mask to form the source/drain contacts. The source/drain contacts have improved structural fidelity compared to contacts formed using multiple masks because the spaces between contact structures are formed as lines, as opposed to spaces that are formed by using multiple masks that are patterned onto the ILD. Further, a single etch with reduced aspect ratio into the ILD improves selectivity. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 1A:
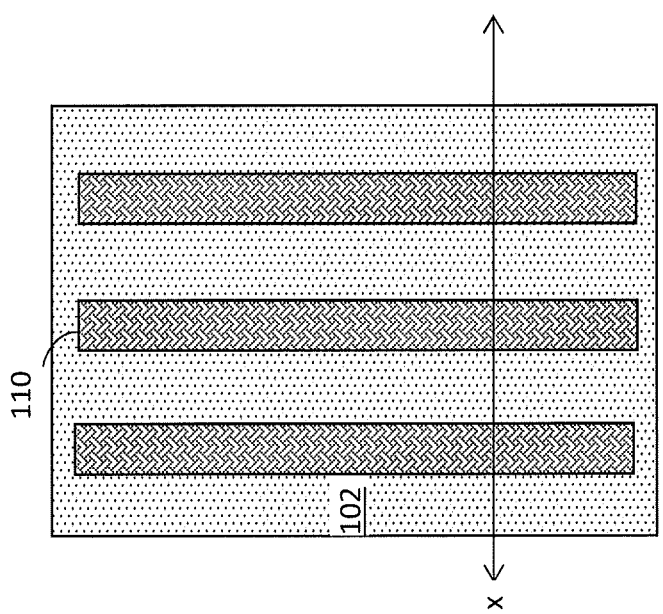

Turning now to the Figures, FIGS. 1A-6B illustrate exemplary methods of making semiconductors device according to various embodiments. FIG. 1A is a top view of semiconductor device with gate hard masks 110 surrounded by an interlayer dielectric (ILD) 102. FIG. 1B is a cross-sectional side view through the x-axis of FIG. 1A. The gates 140 include gate hard masks 110 disposed on metal gates 120. The gates 140 are formed on a substrate 101. Gate spacers 111 are formed along a sidewall of the metal gates 120.

Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrate 101 materials include silicon-on-insulator (SOI) substrates with buried oxide (BOX) layers.

In some embodiments, the semiconductor device shown in FIGS. 1A and 1B is a FinFET. The fins (not shown) of the FinFET may be formed in the substrate 101 by depositing, for example, a hard mask material, on the substrate 101 and patterning the hard mask material. Sidewall image transfer, for example, may be used to pattern the hard mask material. The fins are then formed by etching through the substrate 101.

To form gates 140, initially "dummy gates" are formed on the fins. The dummy gates are filled with a sacrificial material, for example, amorphous silicon (aSi) or polycrystalline silicon (polysilicon).

The dummy gates are surrounded by the gate spacers 111. The gate spacer 111 material may deposited on the substrate 101 by a deposition process, for example, chemical vapor deposition (CVD) or physical vapor deposition (PVD). The gate spacer 111 material may be etched by a dry etch process, for example, a reactive ion etch (ME) process. The gate spacers 111 include a low-k dielectric material. Non-limiting examples of suitable materials for the gate spacers 111 include dielectric oxides (e.g., silicon oxide), dielectric nitrides (e.g., silicon nitride), dielectric oxynitrides, SiOCN, SiBN, SiCN, SiBCN, or any combination thereof.

To form source/drains in the regions 150 between the gates 140, a portion of the ILD layer 102 is between the dummy gates is removed. An epitaxial growth process may be performed to deposit a crystalline layer onto the substrate 101. Epitaxial layers may be grown using vapor-phase epitaxy (VPE), molecular-beam epitaxy (MBE), liquid-phase epitaxy (LPE), or other process. The epitaxial layers may include, for example, silicon, silicon germanium, and/or carbon doped silicon (Si:C). The epitaxial layers may be doped during deposition by adding a dopant or impurity to form a silicide. Alternatively, the source/drain regions may be formed by incorporating dopants into the substrate 101 in the region 150. After forming the source/drains, the ILD layer 102 is re-deposited onto region 150.

To form the gates 140, the sacrificial material within the dummy gates is removed after forming the source/drains, for example, by performing at least one etch. The sacrificial material is replaced with the metal gates 120. The high-k metal gate stack includes one or more high-k dielectric materials, one or more workfunction metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between, for example, NFET and PFETs. Non-limiting examples of suitable work function metals include p-type work function metal materials and n-type work function metal materials. P-type work function materials include compositions such as ruthenium, palladium, platinum, cobalt, nickel, metal nitrides (e.g., titanium nitride) and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the metal gates 120. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal to form the metal gates 120.

The gates are then recessed using a selective RIE process that recesses the metal gates 120 selectively with respect to the gate spacers 111 and ILD layer 102. A hard mask material is then deposited on top of the recessed metal gates 120 to form gate hard masks 110 (hard mask caps). The gate hard masks 110 may include a nitride material, for example, silicon nitride.

The ILD layer 102 (dielectric layer) surrounds the gates 140. The ILD layer 102 may include, but is not limited to, low-k dielectric oxides, for example silicon dioxide, spin-on-glass, a flowable oxide (FOX), a high density plasma (HDP) oxide, borophosphosilicate glass (BPSG), or any combination thereof. The ILD layer 102 may be deposited by a deposition process, including, but not limited to CVD, PVD, plasma enhanced CVD, atomic layer deposition (ALD), evaporation, chemical solution deposition, or like processes.

In some embodiments, the semiconductor device includes at least a first gate, a second gate, and a third gate. In other embodiments, the semiconductor device includes two gates, three gates, four gates, or any number of gates.

Figure 2B:
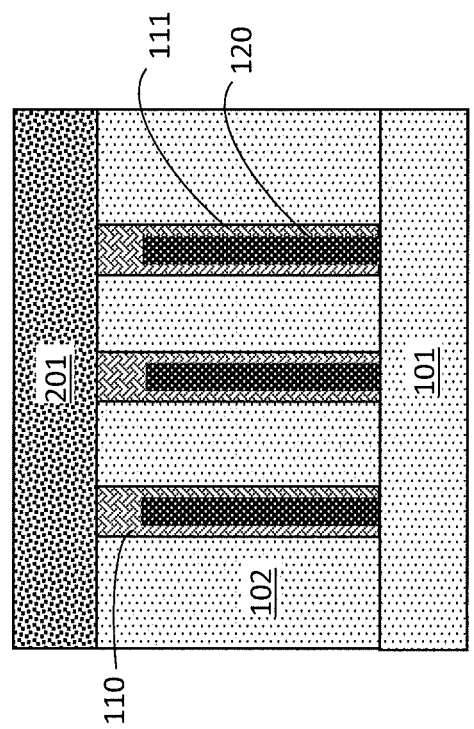
FIG. 2B is a cross-sectional side view of FIG. 2A.
Figure 2A:
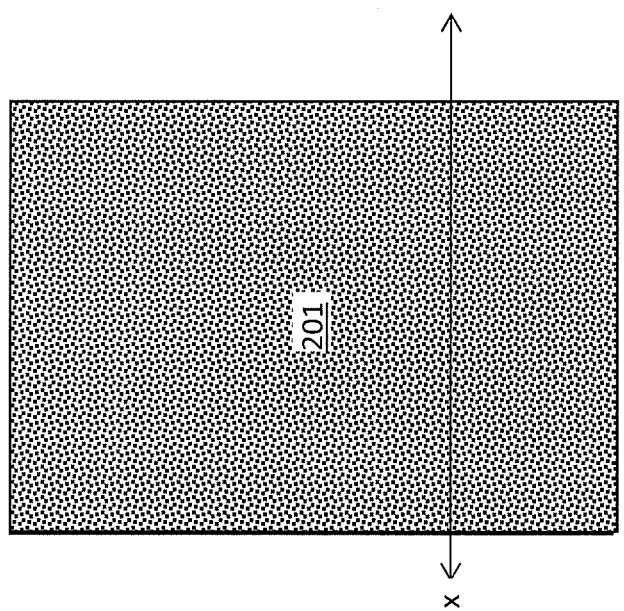
FIG. 2A is a top view after disposing a hard mask on the gates.

FIG. 2A is a top view after disposing a sacrificial hard mask 201 on the gates 140. FIG. 2B is a cross-sectional side view through the x-axis of FIG. 2A. The hard mask 201 is deposited on the gate hard masks 110 and the ILD layer 102 (dielectric layer). The sacrificial hard mask 201 may include, for example, amorphous silicon, titanium nitride, or a combination thereof.

The sacrificial hard mask 201 may be deposited by a deposition process that depends on the type of material. Non-limiting examples of deposition processes include physical vapor deposition (PVD), chemical vapor deposition (CVD), plasma enhanced chemical vapor deposition (PECVD), inductively coupled plasma chemical vapor deposition (ICP CVD), or any combination thereof.

The thickness of the sacrificial hard mask 201 may vary and is not intended to be limited. In some embodiments, the thickness of the sacrificial hard mask 201 is in a range from about 5 to about 100 nm. In other embodiments, the thickness of the sacrificial hard mask 201 is in a range from about 10 to about 20 nm.

Figure 3B:
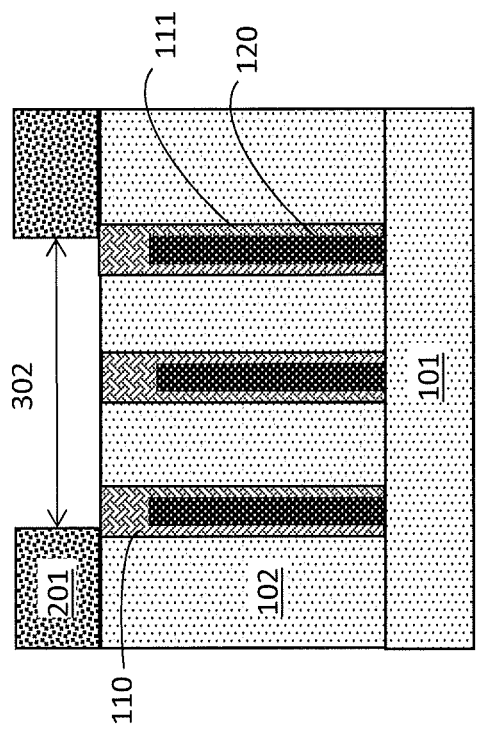
FIG. 3B is a cross-sectional side view of FIG. 3A.
Figure 3A:
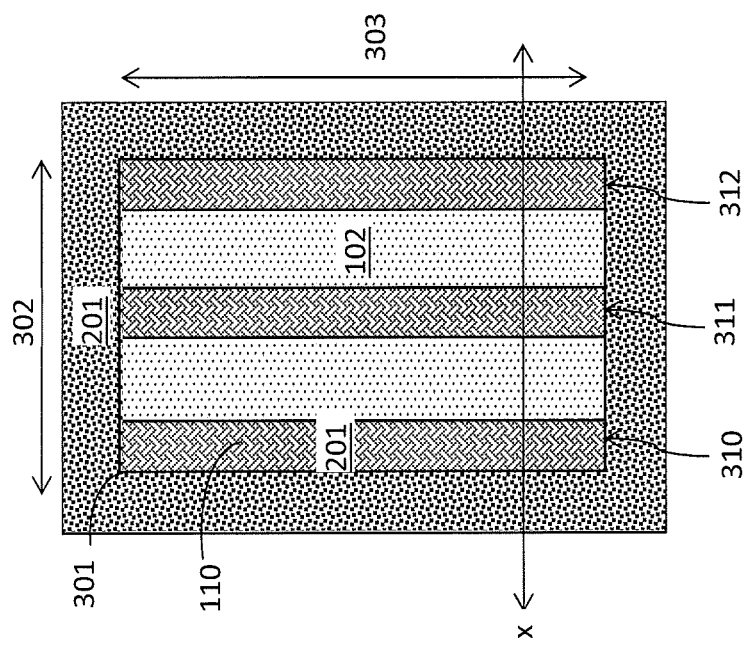
FIG. 3A is a top view after removing a portion of the hard mask to form an opening in the patterned hard mask and expose the gates.

FIG. 3A is a top view after removing a portion of the sacrificial hard mask 201 to form a patterned hard mask and expose the gate hard masks 110 and ILD layers 102 between the gate hard masks 110 of the gates 140. FIG. 3B is a cross-sectional side view through the x-axis of FIG. 3A. Enough of the sacrificial hard mask 201 material is removed to expose the ILD layer 102 between two gates 140.

In some embodiments, the semiconductor device includes three gates 140, a first gate 310, a second gate 311, and a third gate 311. The ILD layer 102 between the first and second gates 310, 311 is exposed, and the ILD layer 102 between the second and third gates 311, 312 is exposed.

The method for removing a portion of the sacrificial hard mask 201 (lithography and etching) depends on the material forming the sacrificial hard mask 201. Non-limiting examples of methods for etching the sacrificial hard mask 201 include reactive ion etching (RIE) and chemical wet etching.

In one exemplary embodiment, a photoresist is disposed on the sacrificial hard mask 201 and patterned by exposing to a desired pattern of radiation. The exposed photoresist is developed and with a resist developer to provide a patterned photoresist. The photoresist pattern is transferred through the sacrificial hard mask 201 by etching. Then the photoresist is removed.

The patterned sacrificial hard mask 201 includes a large open area 301 (opening), in which at least two gates 140 or at least three gates 140 (first gate 310, second gate 311, and third gate 312) are exposed. Enough of the sacrificial hard mask 201 is removed to expose the ILD layer 102 disposed over the source/drain regions (see regions 150 in FIG. 1B).

The open area 301 has a first dimension 302 and a second dimension 303. In some embodiments, the first dimension 302 is in a range from about 50 nm to about 100 microns, and the second dimension is in a range from about 50 nm to about 100 microns.

Figure 4B:
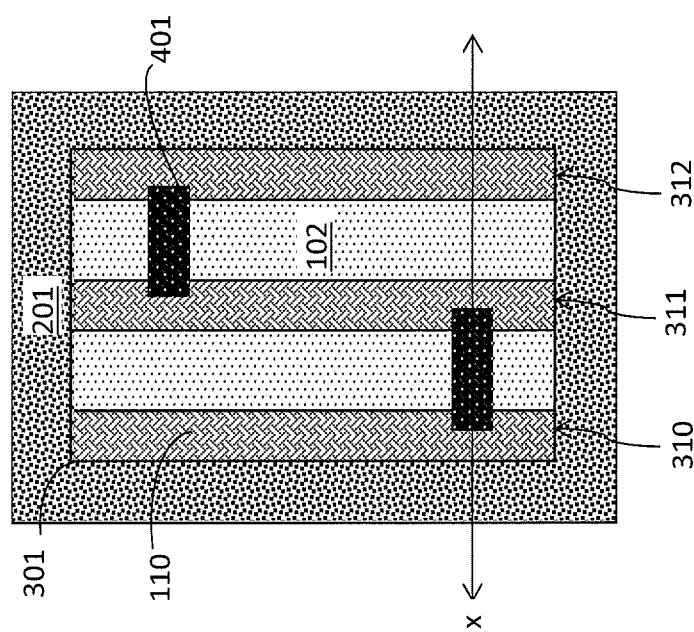
FIG. 4B is a cross-sectional side of FIG. 4A.
Figure 4A:
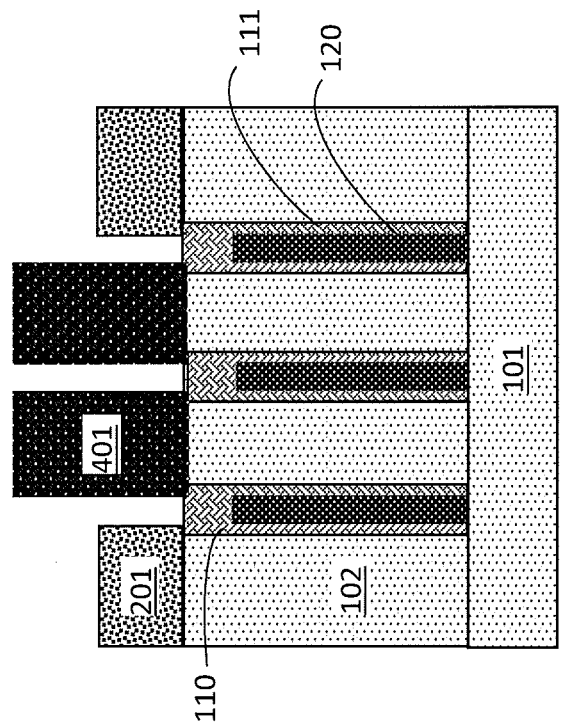
FIG. 4A is a top view after disposing and patterning a soft mask within the opening of patterned hard mask.

FIG. 4A is a top view after disposing and patterning a soft mask 401 within the patterned sacrificial hard mask 201. FIG. 4B is a cross-sectional side through the x-axis of FIG. 4A.

A soft mask 401 material is deposited on the gate hard masks 110 and the ILD layer 102 within the open area 301 of the sacrificial hard mask 201. The soft mask 401 material may be initially deposited as a blanket/conformal layer covering the sacrificial hard mask 201, the ILD layer 102, and the gate hard masks 110 of the gates 140. In some embodiments, the soft mask material 401 is deposited on the first, second, and third gates 310, 311, 312 within the open area 301.

The soft mask 401 may include, but is not limited to, polymeric materials (e.g., polymeric spin-on materials). In one embodiment, the soft mask 401 includes a resist (e.g., a photoresist). When the soft mask 401 is a photoresist, the soft mask 401 is patterned by exposing the photoresist to a desired radiation pattern and developing with a resist developer. The photoresist pattern is transferred into the soft mask 401 by performing an etching process. The etching process may be, for example, a dry etching process (e.g., RIE).

In another embodiment, the soft mask 401 includes an organic planarization layer (OPL) material, a spin-on coating, an organic spin-on material, or a polymeric spin-on material. When the soft mask 401 includes an OPL material, the soft mask 401 is patterned by disposing an etch mask (not shown) on the OPL. The etch mask (not shown) may be a resist material, for example, a photoresist material. The resist is patterned as described above in FIG. 3A. Then the photoresist pattern is transferred into the OPL by removing the OPL material by, for example, a dry etching process (e.g., an RIE process).

A first portion of the patterned soft mask 401 material extends from one gate 110 (a first gate 310) over the ILD layer 102 to another gate 110 (second gate 311). A second portion of the patterned soft mask 401 material extends from one gate 110 (second gate 311) to another adjacent gate 110 (third gate 312).

The soft mask 401 may be patterned to provide a single soft mask portion between any two gate hard masks 110. The dimensions of the portions of the patterned soft mask 401 generally vary and depend on the type of device and other device dimensions. The soft mask material may be patterned to form one portion, two portion, three portions, or more than three discrete portions.

The thickness of the soft mask 401 material may be greater than the hard mask 201 and extend over the hard mask 201. In some embodiments, the thickness of the soft mask 401 (including any discrete portions) is in a range from about 20 to about 500 nm. In other embodiments, the thickness of the soft mask 401 (including any discrete portions) is in a range from about 50 to about 200 nm.

FIG. 5A is a top view after removing a portion of the ILD layer 102 around the patterned soft mask 401 and within the open area 301 of the hard mask 201 to form contact trenches 501. FIG. 5B is a cross-sectional side view through the x-axis of FIG. 5A.

The contact trenches 501 (contact openings) extend between the gates 110. At least two contact trenches 501 are formed between gate hard masks 110. A first contact trench 501 (contact opening) is formed between first gate 310 and second gate 311. A second contact trench 501 (contact opening) is formed between second gate 311 and third gate 312.

An etching process is employed to remove the ILD layer 102 material between the gates 110 and form the contact trenches 501. The ILD layer 102 material is removed down to the level of region 150 and so that the contact trench 501 is in contact with the region 150 where the source/drain is present. The etching process may be, for example, a dry etching process (e.g., RIE).

The dimensions of the contact trenches 501 vary and depend on other device dimensions. The contact trenches 501 have substantially linear (or planar) sidewalls. The contact trenches 501 have a sidewall in contact with the gate spacers 111 between adjacent gates 140. The trench contacts 501 have a sidewall in contact with the regions 150 where the source/drain is disposed/formed on the substrate 101. The sidewall in contact with the regions 150 forming the source/drain is substantially linear.

In some embodiments, a first contact trench 510 (first contact opening) extends from a sidewall of the first gate 310 to a sidewall of the second gate 311 and has a sidewall that is substantially perpendicular to the first gate 310 and the second gate 311. Another second contact trench 501 (second contact opening) also extends from a sidewall of the first gate 310 to a sidewall of the second gate 311 and has a sidewall that is substantially perpendicular to the first gate 310 and the second gate 311. The second contact trench 511 may be smaller than the first contact trench 510. A third contact trench 512 (third contact opening 512) extends from a sidewall of the second gate 311 to a sidewall of the third gate 312 and has a sidewall that is substantially perpendicular to the second gate 311 and third gate 312. A fourth contact trench 513 (fourth contact opening) extends from a sidewall of the second gate 311 to a sidewall of the third gate 312 and has a sidewall that is substantially perpendicular to the second gate 311 and third gate 312. The fourth contact trench 513 may be smaller than the third contact trench 512.

In other embodiments, the contact trenches 501 have sidewalls that are substantially linear. Yet, in one embodiment, the contact trenches 501 have sidewalls (periphery) that is not convex-shaped and not concave-shaped.

Figure 6B:
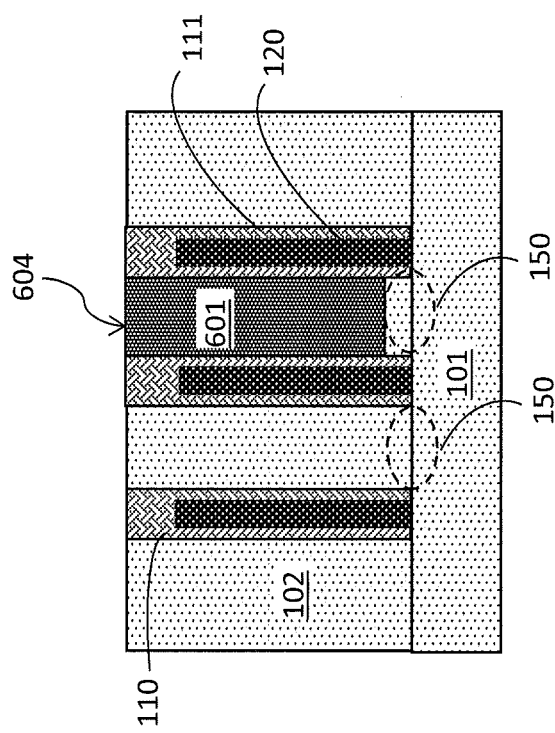
Figure 6A:
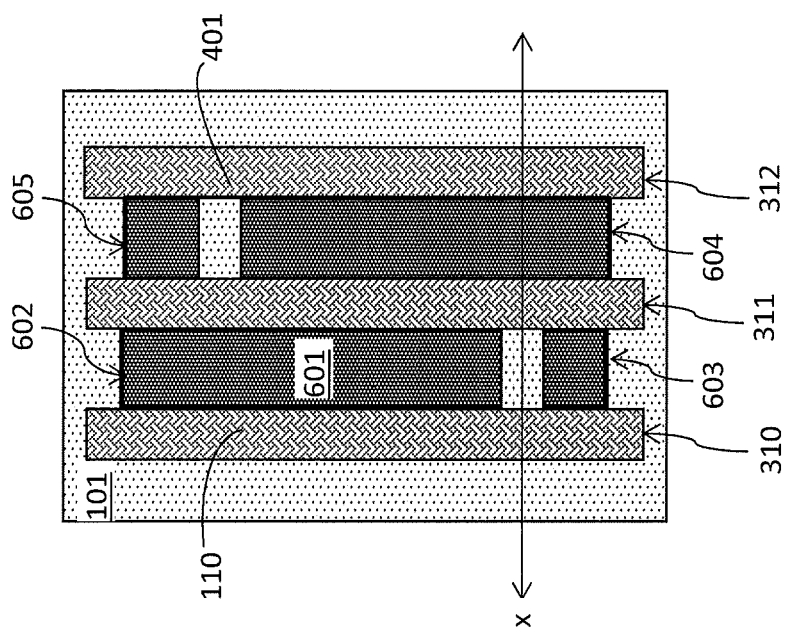
FIG. 6A is a top view after filling the trench contacts with a conductive material.

FIG. 6A is a top view after filling the contact trenches 501 with a conductive material. FIG. 6B is a cross-sectional side view through the x-axis of FIG. 6A. The hard mask 201 and the soft mask 401 is removed before depositing the conductive material.

A conductive material 601 is disposed in the contact trenches 501 to form source/drain contacts. A first source/drain contact 602, a second source/drain contact 603, a third source/drain contact 604, and a fourth source/drain contact 605 are formed.

The source/drain contacts have substantially linear (or planar) sidewalls. The source/drain contacts have a sidewall in contact with the gate spacers 111 between adjacent gates 140. The source/drain contacts have a sidewall in contact with the regions 150 where the source/drain is disposed/formed on the substrate 101. The sidewall in contact with the regions 150 forming the source/drain is substantially linear.

The conductive material 601 may be a conductive metal. Non-limiting examples of conductive metals include tungsten, aluminum copper, or any combination thereof. The conductive material may be formed by a deposition method. Non-limiting examples of deposition methods include chemical vapor deposition (CVD), physical vapor deposition (PVD), atomic layer deposition (ALD), or any combination thereof.

Optionally, a contact liner (not shown) may be disposed in the contact trenches 501 before depositing the conductive material 601. The liner 221 includes any low contact resistance material or conductive liner material. Non-limiting examples of suitable low contact resistance materials for the contact liner include titanium, titanium nitride, tantalum, tantalum nitride, tungsten, niobium, cobalt, cobalt titanium, nickel, platinum, or any combination thereof. The contact liner can be formed as a single liner or a multi-layer liner of one or more materials.

A planarization process is performed to remove the conductive material 601 (and the optional contact liner material)

down to the level of the ILD layer 102. The planarization process may be, for example, a CMP process.

As described above, various embodiments described herein include methods for forming contacts in semiconductor devices that minimize the number of masks and patterning steps. After forming a hard mask cap on the gate, a sacrificial hard mask (block mask) is disposed on the gates and patterned to protect the field areas around the gates. Then a soft mask is disposed and patterned on the gate hard masks within the patterned hard mask area. The ILD is etched to form contact trenches in the areas within the patterned hard mask and around the patterned soft mask. After removing the masks, the contact trenches are filled with a conductive material to form source/drain contacts. The methods described herein do not use multiple masks to form the source/drain contacts. The source/drain contacts have improved structural fidelity compared to contacts formed using multiple masks because the contact structures are formed as lines, as opposed to spaces in masks. Further, a single etch with reduced aspect ratio into the ILD improves selectivity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:
   depositing a hard mask on a dielectric layer disposed on a substrate, the dielectric layer being disposed around a first gate, a second gate, and a third gate extending from an exposed surface of the dielectric layer to the substrate;
   removing a portion of the hard mask to form an opening within the hard mask that exposes the first gate, the second gate, and the third gate;
   forming a patterned soft mask on the first, second, and third gates within the opening of the hard mask, a first portion of the patterned soft mask being disposed on the first gate and the second gate, and a second portion of the patterned soft mask being disposed on the second gate and the third gate;
   removing portions of the dielectric layer to transfer the pattern of the patterned soft mask into the dielectric layer and form a first contact opening and a second contact opening between the first gate and the second gate, and a third contact opening and a fourth contact opening between the second gate and the third gate; and
   disposing a conductive material in the first, second, third, and fourth contact openings.

2. The method of claim 1, wherein the first gate, the second gate, and the third gate comprise hard mask caps, and the hard mask caps are exposed after removing the portion of the hard mask.

3. The method of claim 2, wherein the hard mask caps comprise silicon nitride.

4. The method of claim 1, wherein the hard mask comprises amorphous silicon, titanium nitride, or a combination thereof.

5. The method of claim 1, wherein the patterned soft mask comprises a photoresist material, a polymeric material, or a combination thereof.

6. The method of claim 1, wherein the first and second contact openings extend from a sidewall of the first gate to a sidewall of the second gate and have a sidewall that is substantially perpendicular to the first gate and the second gate, and the third and fourth contact openings extend from a sidewall of the second gate to a sidewall of the third gate and have a sidewall that is substantially perpendicular to the second gate and third gate.

7. A method of making a semiconductor device, the method comprising:
   depositing a hard mask on a dielectric layer disposed on a substrate, the dielectric layer being disposed around a first gate, a second gate, and a third gate extending from an exposed surface of the dielectric layer to the substrate;
   removing a portion of the hard mask to form an opening within the hard mask that exposes the first gate, the second gate, and the third gate;
   disposing a soft mask material on the first, second, and third gates within the opening of the hard mask;
   removing portions of the soft mask material to form a first soft mask portion that is disposed on and extends from the first gate to the second gate, and a second soft mask portion that is disposed on and extends from the second gate to the third gate;
   removing portions of the dielectric layer to transfer a pattern of the first soft mask portion into the dielectric layer and form a first contact opening and a second contact opening between the first gate and the second gate, and to transfer a pattern of the second soft mask portion into the dielectric layer and form a third contact opening and a fourth contact opening between the second gate and the third gate; and disposing a conductive material in the first, second, third, and fourth contact openings.

8. The method of claim 7, wherein the soft mask material is thicker than the hard mask and extends over the hard mask.

9. The method of claim 7, wherein the second contact opening is smaller than the first contact opening, and the fourth contact opening is smaller than the third contact opening.

10. The method of claim 7, wherein the first and second contact openings extend from a sidewall of the first gate to a sidewall of the second gate and have a sidewall that is substantially perpendicular to the first gate and the second gate, and the third and fourth contact openings extends from a sidewall of the second gate to a sidewall of the third gate and have a sidewall that is substantially perpendicular to the second gate and third gate.

11. The method of claim 7, wherein the soft mask material is an organic material.

12. The method of claim 7, wherein a hard mask material is amorphous silicon, titanium nitride, or a combination thereof.

13. The method of claim 7, wherein the conductive material is tungsten, aluminum copper, or any combination thereof.

14. The method of claim 7, further comprising removing the hard mask, the first soft mask portion, and the second soft mask portion before disposing the conductive material in the first, second, third, and fourth contact openings.

15. The method of claim 7, wherein the first gate, the second gate, and the third gate comprise hard mask caps, and the hard mask caps are exposed after removing the portion of the hard mask.

* * * * *